US011635470B2

(12) United States Patent
Koga et al.

(10) Patent No.: US 11,635,470 B2
(45) Date of Patent: Apr. 25, 2023

(54) SECONDARY BATTERY SYSTEM AND SOC ESTIMATION METHOD FOR SECONDARY BATTERY

(71) Applicants: TOYOTA JIDOSHA KABUSHIKI KAISHA, Toyota (JP); Panasonic Corporation, Kadoma (JP)

(72) Inventors: Tatsuya Koga, Toyota (JP); Hiroki Nagai, Aichi-ken (JP); Mina Nishigaki, Toyota (JP); Daisuke Nishide, Hyogo (JP); Ryushiro Tokunaga, Hyogo (JP)

(73) Assignees: TOYOTA JIDOSHA KABUSHIKI KAISHA, Toyota (JP); PANASONIC HOLDINGS CORPORATION, Kadoma (JP)

( * ) Notice: Subject to any disclaimer, the term of this patent is extended or adjusted under 35 U.S.C. 154(b) by 638 days.

(21) Appl. No.: 16/560,430

(22) Filed: Sep. 4, 2019

(65) Prior Publication Data

US 2020/0072911 A1 Mar. 5, 2020

(30) Foreign Application Priority Data

Sep. 5, 2018 (JP) .............................. JP2018-165779

(51) Int. Cl.
| | | |
|---|---|---|
| *G01R 31/392* | (2019.01) | |
| *G01R 31/388* | (2019.01) | |
| *H01M 4/134* | (2010.01) | |
| *H01M 4/38* | (2006.01) | |
| *H01M 10/48* | (2006.01) | |

(52) U.S. Cl.
CPC ......... *G01R 31/392* (2019.01); *G01R 31/388* (2019.01); *H01M 4/134* (2013.01); *H01M 4/386* (2013.01); *H01M 10/48* (2013.01)

(58) Field of Classification Search
CPC ... G01R 31/392; G01R 31/388; H01M 4/134; H01M 4/386
See application file for complete search history.

(56) References Cited

U.S. PATENT DOCUMENTS

| | | | | |
|---|---|---|---|---|
| 9,500,713 | B1* | 11/2016 | Ghantous | ........... G01R 31/3835 |
| 9,755,280 | B2* | 9/2017 | Kaburagi | .............. H02J 7/1461 |
| 2006/0091863 | A1* | 5/2006 | Melichar | ............ G01R 31/3828 |
| | | | | 320/132 |
| 2009/0210179 | A1* | 8/2009 | Tang | ..................... H01M 10/48 |
| | | | | 702/63 |

(Continued)

FOREIGN PATENT DOCUMENTS

| | | |
|---|---|---|
| JP | 2014-139521 A | 7/2014 |
| JP | 2015-079621 A | 4/2015 |

(Continued)

*Primary Examiner* — Yoshihisa Ishizuka
*Assistant Examiner* — Christopher J Gassen
(74) *Attorney, Agent, or Firm* — Sughrue Mion, PLLC (57) ABSTRACT

An ECU is configured to execute SOC estimation control for estimating an SOC of a battery. The ECU obtains "first voltage" indicating an OCV of the battery in the SOC estimation control. The ECU controls an engine and a PCU such that the battery is charged with an amount of electric power equal to or larger than a prescribed amount, when the first voltage is within a voltage range where hysteresis occurs. The ECU obtains "second voltage" indicating an OCV of the charged battery, and estimates the SOC of the battery from the second voltage.

10 Claims, 6 Drawing Sheets

(56) References Cited

U.S. PATENT DOCUMENTS

| | | | |
|---|---|---|---|
| 2012/0274331 A1* | 11/2012 | Liu | G01R 31/3835 324/426 |
| 2015/0253389 A1* | 9/2015 | Arai | G01R 31/3828 324/427 |
| 2015/0355285 A1 | 12/2015 | Nishigaki et al. | |
| 2016/0072125 A1 | 3/2016 | Kimura et al. | |
| 2017/0010327 A1* | 1/2017 | Nishiguchi | G01R 31/367 |
| 2018/0306866 A1* | 10/2018 | Tam | G01R 31/387 |
| 2019/0023131 A1 | 1/2019 | Katayama et al. | |

FOREIGN PATENT DOCUMENTS

| | | |
|---|---|---|
| JP | 2016-058236 A | 4/2016 |
| JP | 2018-136158 A | 8/2018 |
| WO | 2008/026476 A1 | 3/2008 |
| WO | 2017/179266 A1 | 10/2017 |

\* cited by examiner

SECONDARY BATTERY SYSTEM AND SOC ESTIMATION METHOD FOR SECONDARY BATTERY

This nonprovisional application is based on Japanese Patent Application No. 2018-165779 filed on Sep. 5, 2018 with the Japan Patent Office, the entire contents of which are hereby incorporated by reference.

BACKGROUND

Field

The present disclosure relates to a secondary battery system and an SOC estimation method for a secondary battery, and more particularly to a technique of estimating an SOC from an OCV of a secondary battery.

Description of the Background Art

In recent years, an electric powered vehicle (such as a hybrid vehicle or an electric vehicle) on which a secondary battery for traveling is mounted has becoming widespread. Such an electric powered vehicle requires a technique of estimating a state of charge (SOC) of the secondary battery with a high degree of accuracy in order to appropriately control charging and discharging of the secondary battery. As such a technique, there has been proposed a technique of estimating an SOC from an open circuit voltage (OCV) of the secondary battery. For example, International Publication. No. 2008/026476 discloses a technique of obtaining an OCV when a voltage across terminals of a secondary battery reaches equilibrium sufficiently, and estimating an SOC from the OCV by using a characteristic curve indicating a relation between the OCV and the SOC.

SUMMARY

Depending on a configuration of a secondary battery, a charging curve indicating a relation between the OCV and the SOC of the secondary battery during charging of the secondary battery may be different from a discharging curve indicating a relation between the OCV and the SOC of the secondary battery during discharging of the secondary battery. This phenomenon is called "hysteresis". When the hysteresis occurs, the SOC corresponding to the OCV is not uniquely determined because the SOC corresponding to the OCV during charging is different from that during discharging. Thus, it may be impossible to estimate the SOC from the OCV with a high degree of accuracy.

The method disclosed in International Publication No. 2008/026476 does not take the hysteresis of the secondary battery into consideration. Therefore, it may be impossible to obtain the desired accuracy of estimation of the SOC, depending on a charging and discharging history of the secondary battery.

The present disclosure has been made in order to solve the above-described problem, and an object of the present disclosure is to enhance the accuracy of estimation of an SOC in a secondary battery system including a secondary battery where hysteresis occurs.

(1) A secondary battery system according to an aspect of the present disclosure includes: a secondary battery where hysteresis occurs, the hysteresis being a phenomenon in which an SOC corresponding to an OCV during charging is different from that during discharging; a charger configured to charge the secondary battery; and a controller configured to control the charger and to estimate an SOC of the secondary battery. The controller is configured to: obtain a first voltage that is an OCV of the secondary battery; control the charger such that the secondary battery is charged with an amount of electric power larger than a prescribed amount, when the first voltage is within a voltage range where the hysteresis occurs; and obtain a second voltage that is an OCV of the charged secondary battery, and estimate the SOC of the secondary battery from the second voltage.

(2) The controller includes a memory having a charging curve and a discharging curve stored therein, the charging curve indicating a relation between the OCV and the SOC of the secondary battery when the secondary battery is charged from a completely discharged state to a fully charged state, the discharging curve indicating a relation between the OCV and the SOC of the secondary battery when the secondary battery is discharged from the fully charged state to the completely discharged state. The controller is configured to, when obtaining the second voltage, estimate the SOC of the secondary battery from the second voltage by referring to the charging curve.

(3) The prescribed amount is determined such that an error between the OCV of the secondary battery charged with the amount of electric power larger than the prescribed amount and the OCV on the charging curve is smaller than a reference value.

(4) The secondary battery is a lithium ion secondary battery having a negative electrode including an alloy-based active material. The alloy-based active material includes at least one of silicon, tin and silicon oxide.

According to the above-described configuration, when the OCV (first voltage) of the secondary battery is within the voltage range where the hysteresis in accordance with a charging and discharging history of the secondary battery exists, the secondary battery is charged with the amount of electric power equal to or larger than the prescribed amount. As a result, the hysteresis is temporarily eliminated (details will be described below) and the SOC corresponding to the OCV is uniquely determined on the characteristic curve (more specifically, the charging curve). Therefore, by obtaining the OCV (second voltage) of the secondary battery and estimating the SOC from the OCV, the accuracy of estimation of the SOC can be enhanced.

(5) An SOC estimation method for a secondary battery according to another aspect of the present disclosure is a method for estimating an SOC of the secondary battery where hysteresis occurs, the hysteresis being a phenomenon in which an SOC corresponding to an OCV during charging is different from that during discharging. The SOC estimation method for the secondary battery includes: obtaining a first voltage that is an OCV of the secondary battery; charging the secondary battery with an amount of electric power equal to or larger than a prescribed amount, when the first voltage is within a voltage range where the hysteresis occurs; and obtaining a second voltage that is an OCV of the secondary battery after performing the charging, and estimating the SOC of the secondary battery from the second voltage.

According to the above-described method, the accuracy of estimation of the SOC can be enhanced similarly to the configuration of (1) described above.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

An embodiment of the present disclosure will be described in detail hereinafter with reference to the drawings, in which the same or corresponding portions are denoted by the same reference characters and description thereof will not be repeated.

The embodiment will be described below in connection with a configuration in which a secondary battery system according to the present disclosure is mounted on a hybrid vehicle. However, a type of an electric powered vehicle on which the secondary battery system according to the present embodiment is mounted is not particularly limited, and may be an electric vehicle, a plug-in hybrid vehicle, a fuel cell vehicle or the like. In addition, the secondary battery system according to the present disclosure is not limited to a secondary battery system for a vehicle, and may be, for example, a stationary secondary battery system.

Embodiment

<Configuration of Secondary Battery System>

Figure 1:
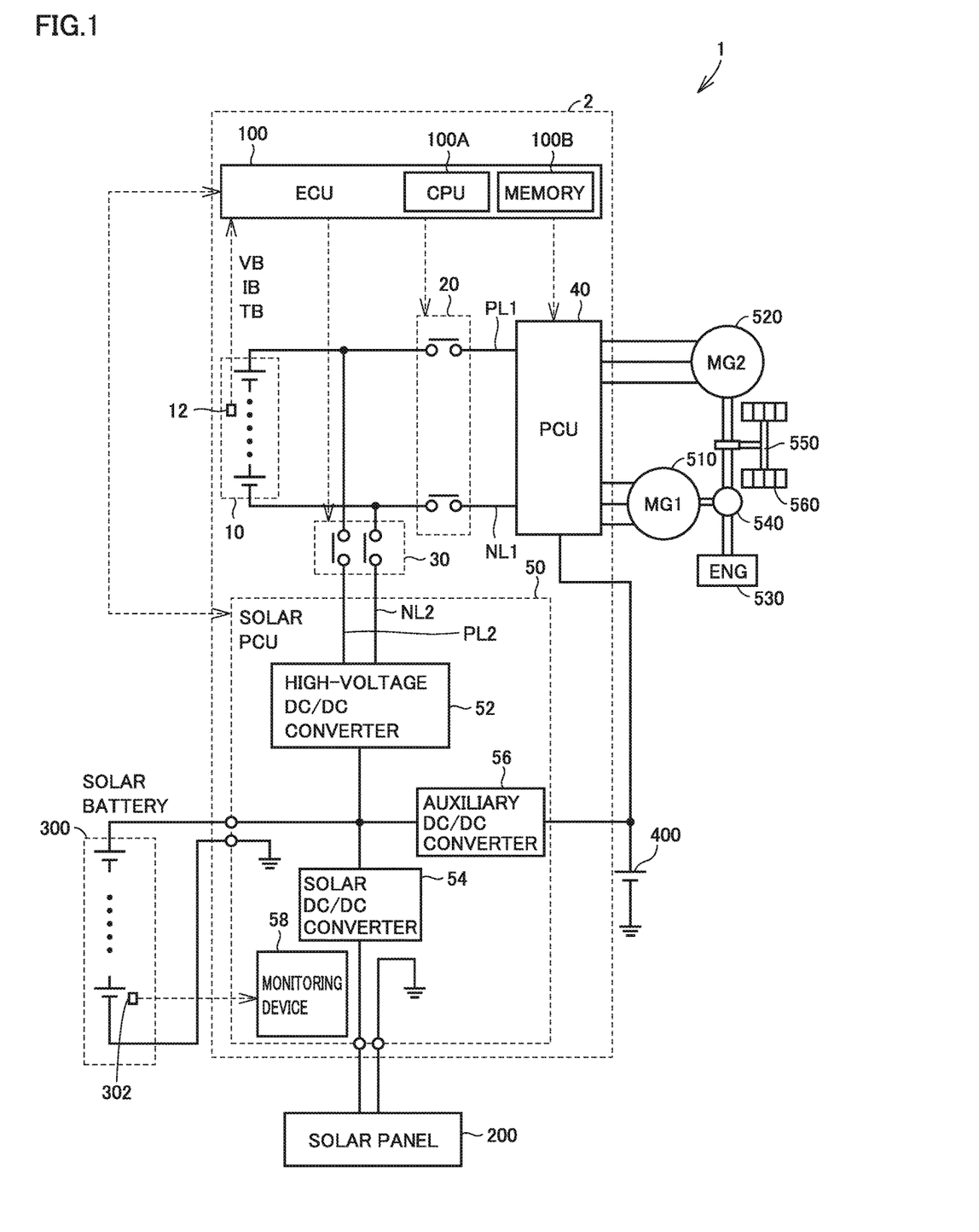
FIG. 1 is a block diagram schematically showing an overall configuration of a vehicle on which a secondary battery system according to the present embodiment is mounted.

FIG. 1 schematically shows an overall configuration of a hybrid vehicle on which the secondary battery system according to the present embodiment is mounted. Referring to FIG. 1, a vehicle 1 includes a secondary battery system 2, a solar panel 200, a solar battery 300, an auxiliary battery 400, motor generators 510 and 520, an engine 530, a power split device 540, a drive shaft 550, and a driving wheel 560. Secondary battery system 2 includes a battery 10, a system main relay (SMR) 20, a charging relay 30, a power control unit (PCU) 40, a solar PCU 50, and an electronic control unit (ECU) 100.

Each of motor generators 510 and 520 is an AC rotating electric machine, and is, for example, a three-phase AC synchronous motor including a rotor in which a permanent magnet is embedded.

Motor generator 510 is mainly used as a generator driven by engine 530 through power split device 540. Electric power generated by motor generator 510 is supplied to motor generator 520 or battery 10 through PCU 40.

Motor generator 520 mainly operates as a motor and drives driving wheel 560. Motor generator 520 receives at least one of the electric power from battery 10 and the electric power generated by motor generator 510 and is driven, and the driving force of motor generator 520 is transmitted to drive shaft 550. On the other hand, during braking of the vehicle or during acceleration reduction at a downward slope, motor generator 520 operates as a generator and performs regenerative power generation. Electric power generated by motor generator 520 is supplied to battery 10 through PCU 40.

Engine 530 is an internal combustion engine configured to convert the combustion energy generated when an air-fuel mixture is burned to the kinetic energy of moving elements such as a piston and a rotor, thereby outputting motive power.

Power split device 540 includes, for example, a planetary gear mechanism having three rotation shafts of a sun gear, a carrier and a ring gear. Power split device 540 splits the motive power output from engine 530 into motive power for driving motor generator 510 and motive power for driving driving wheel 560.

Solar panel 200 is a photovoltaic apparatus configured to convert light energy of the sun light to electric energy, thereby generating electric power. Solar panel 200 is mounted on, for example, a surface of a roof of vehicle 1. However, the position at which solar panel 200 is mounted is not particularly limited, and solar panel 200 may be mounted on a surface of a portion (such as a bonnet) other than the roof of vehicle 1. DC power generated by solar panel 200 is supplied to solar battery 300 through solar PCU 50.

Solar battery 300 is a secondary battery configured to store the DC power generated by solar panel 200. Solar battery 300 is configured to include, for example, a plurality of cells connected in series. Each cell is, for example, a nickel-metal hydride battery. However, each cell may be another secondary battery such as a lithium ion secondary battery.

Auxiliary battery 400 supplies electric power to an auxiliary load (not shown). The auxiliary load is, for example, an electric device (such as a navigation device or an audio device, although not shown) provided in a vehicle compartment. The auxiliary load may include various types of ECUs (such as ECU 100) mounted on vehicle 1.

Battery 10 is configured to include a plurality of cells 11 (see FIG. 2), each of which is a lithium ion secondary battery. A detailed configuration of each cell 11 will be described with reference to FIG. 2. Battery 10 stores electric power for driving motor generators 510 and 520, and supplies the electric power to motor generators 510 and 520 through PCU 40. Battery 10 also receives generated electric power through PCU 40 and is charged with the generated electric power during power generation by motor generators 510 and 520. Battery 10 corresponds to "secondary battery" according to the present disclosure.

Battery 10 is provided with a monitoring unit 12. Monitoring unit 12 includes a voltage sensor, a current sensor and a temperature sensor, although all are not shown. The voltage sensor detects a voltage VB of the plurality of cells 11 included in battery 10. The current sensor detects a current IB input and output to and from battery 10. The temperature sensor detects a temperature TB of each cell 11.

SMR 20 is electrically connected to power lines PL1 and NL1 that connect PCU 40 and battery 10. SMR 20 electrically connects or disconnects PCU 40 and battery 10, in response to a control signal from ECU 100.

Charging relay 30 is electrically connected to power lines PL2 and NL2 branching off from power lines PL1 and NL1 and connected to solar PCU 50. Charging relay 30 electrically connects or disconnects power lines PL1 and NL1 and solar PCU 50, in response to a control signal from ECU 100.

PCU 40 performs bidirectional power conversion between battery 10 and motor generators 510 and 520, based on a control signal from ECU 100. PCU 40 is configured to control states of motor generators 510 and 520 individually. For example, PCU 40 can bring motor generator 510 into a regenerative state (power generation state) and motor generator 520 into a power running state. PCU 40 is configured to include, for example, two inverters provided to correspond to motor generators 510 and 520, and a converter configured to boost a DC voltage supplied to each inverter to a voltage equal to or higher than an output voltage of battery 10 (all are not shown). PCU 40 corresponds to one example of "charger" according to the present disclosure.

PCU 40 further includes a DC/DC converter (not shown) configured to convert a voltage of battery 10 to a voltage suitable for charging of auxiliary battery 400. The DC/DC converter supplies the converted electric power to auxiliary battery 400, thereby charging auxiliary battery 400.

Solar PCU 50 converts a voltage of the DC power generated by solar panel 200 to a voltage that allows charging of solar battery 300, or converts a voltage of DC power of solar battery 300 to a voltage that allows charging of battery 10, based on a control signal from ECU 100. Solar PCU 50 corresponds to another example of "charger" according to the present disclosure.

More specifically, solar PCU 50 includes a high-voltage DC/DC converter 52, a solar DC/DC converter 54, an auxiliary DC/DC converter 56, and a monitoring device 58.

High-voltage DC/DC converter 52 converts the voltage of the DC power of solar battery 300 to the voltage (e.g., approximately 200 V) that allows charging of battery 10, and supplies the DC power to battery 10, based on a control signal from ECU 100.

Solar DC/DC converter 54 converts the voltage of the DC power generated by solar panel 200 to the voltage (e.g., approximately several volts) that allows charging of solar battery 300, and supplies the DC power to solar battery 300, based on a control signal from ECU 100.

Auxiliary DC/DC converter 56 converts the voltage of the DC power of solar battery 300 to the voltage (e.g., approximately 12 V) that allows charging of auxiliary battery 400, and supplies the DC power to auxiliary battery 400, based on a control signal from ECU 100.

Monitoring device 58 monitors a state of solar battery 300, based on detection results from the temperature sensor, the voltage sensor and the current sensor (all are not shown) provided in solar battery 300.

ECU 100 is configured to include a CPU (Central Processing Unit) 100A, a memory (more specifically, a ROM (Read Only Memory) and a RAM (Random Access Memory)) 100B, and an input/output port (not shown) configured to input and output various signals. ECU 100 controls engine 530 and PCU 40 based on a signal received from each sensor as well as a program and a map stored in memory 100B, thereby controlling charging and discharging of battery 10 and estimating an SOC of battery 10. A method for estimating the SOC of battery 10 will be described in detail below.

Figure 2:
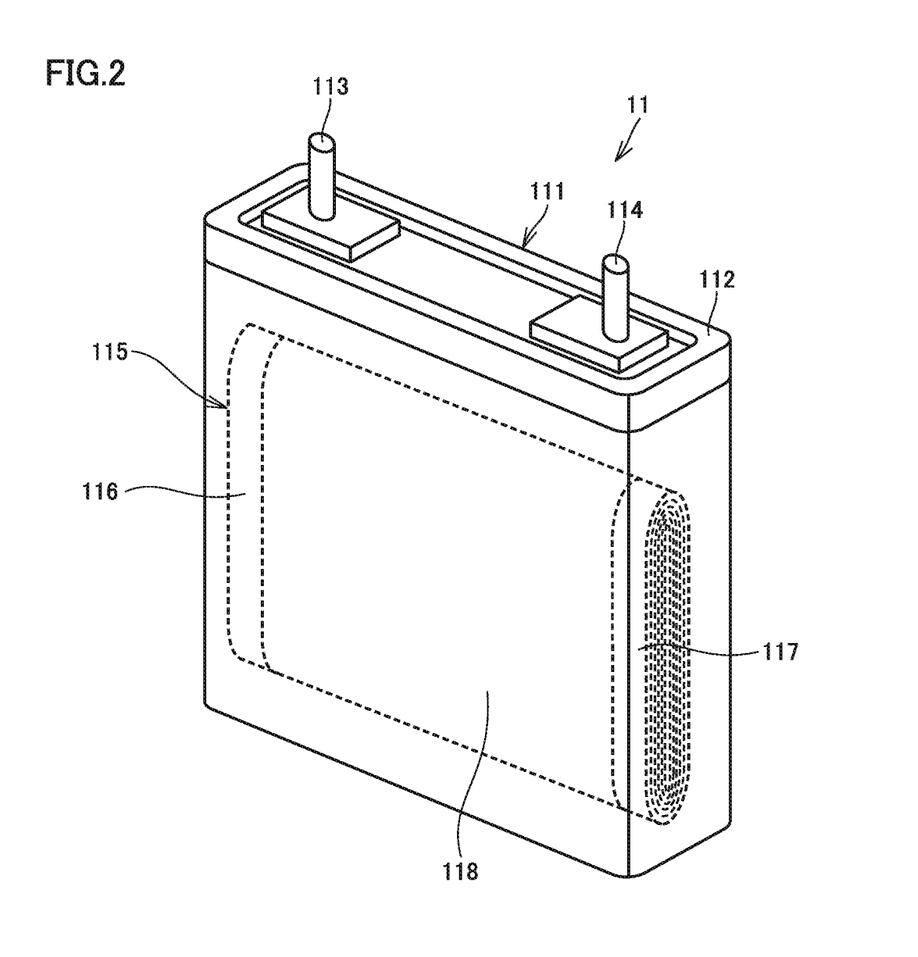
FIG. 2 shows one example of a configuration of each cell.

FIG. 2 shows one example of a configuration of each cell 11. An upper surface of a case 111 of cell 11 is sealed with a lid 112. Lid 112 is provided with a positive electrode terminal 113 and a negative electrode terminal 114. One end of each of positive electrode terminal 113 and negative electrode terminal 114 protrudes from lid 112 to the outside. The other ends of positive electrode terminal 113 and negative electrode terminal 114 are electrically connected to an internal positive electrode terminal and an internal negative electrode terminal (both are not shown) in case 111, respectively.

An electrode assembly 115 is housed in case 111 (in FIG. 2, case 111 is seen through and electrode assembly 115 is indicated by a broken line). Electrode assembly 115 is formed, for example, by winding, in a cylindrical shape, a positive electrode sheet 116 and a negative electrode sheet 117 stacked with a separator 118 being interposed. As described below, various conventionally-known materials can be used as materials of positive electrode sheet 116, negative electrode sheet 117, separator 118, and an electrolyte.

Positive electrode sheet 116 includes a current collecting foil, and a positive electrode active material layer (layer including a positive electrode active material, an electrically conductive material and a binder) formed on a surface of the current collecting foil. Positive electrode sheet 116 includes lithium (e.g., lithium cobalt oxide or lithium manganese oxide).

Similarly to positive electrode sheet 116, negative electrode sheet 117 includes a current collecting foil, and a negative electrode active material layer (layer including a negative electrode active material, an electrically conductive material and a binder) formed on a surface of the current collecting foil. The negative electrode active material includes an alloy-based active material and a carbonic active material. In the present embodiment, the alloy-based active material includes, for example, silicon oxide (SiO), and the carbonic active material includes, for example, graphite (C). However, the alloy-based active material may include at least one of silicon (Si) and tin (Sn), instead of or in addition to silicon oxide. The carbonic active material may include at least one of hard carbon and soft carbon, instead of or in addition to graphite.

Separator 118 is provided to be in contact with both of the positive electrode active material layer and the negative electrode active material layer. Separator 118 is made of, for example, polyolefin.

Electrode assembly 115 (the positive electrode active material layer, the negative electrode active material layer and separator 118) is impregnated with the electrolyte. The electrolyte includes an organic solvent, a lithium ion and an additive. Electrode assembly 115 does not necessarily need to be a wound assembly, and electrode assembly 115 may be an unwound stacked assembly. Although FIG. 2 shows the cell having a rectangular shape, the shape of the cell is not particularly limited and may be, for example, a cylindrical shape.

<Estimation of SOC from OCV>

The following method is known as the method for estimating the SOC of the secondary battery. Specifically, an OCV of the secondary battery is first obtained based on detection results from the voltage sensor and the current sensor provided in the secondary battery. For example, when the current sensor detects that a no-load state (current=0) continues for a prescribed time period, a detection value from the voltage sensor in this state can be obtained as the OCV. Then, the SOC is estimated from the OCV, by referring to a characteristic curve (OCV-SOC curve) indicating a relation between the OCV and the SOC.

However, hysteresis caused by the configuration in which the negative electrode active material includes the alloy-based active material may occur in the secondary battery. As a countermeasure in consideration of an influence of the hysteresis of the secondary battery, it is conceivable to separately prepare a characteristic curve (charging curve) indicating a relation between the OCV and the SOC during charging and a characteristic curve (discharging curve) indicating a relation between the OCV and the SOC during discharging.

Figure 3:
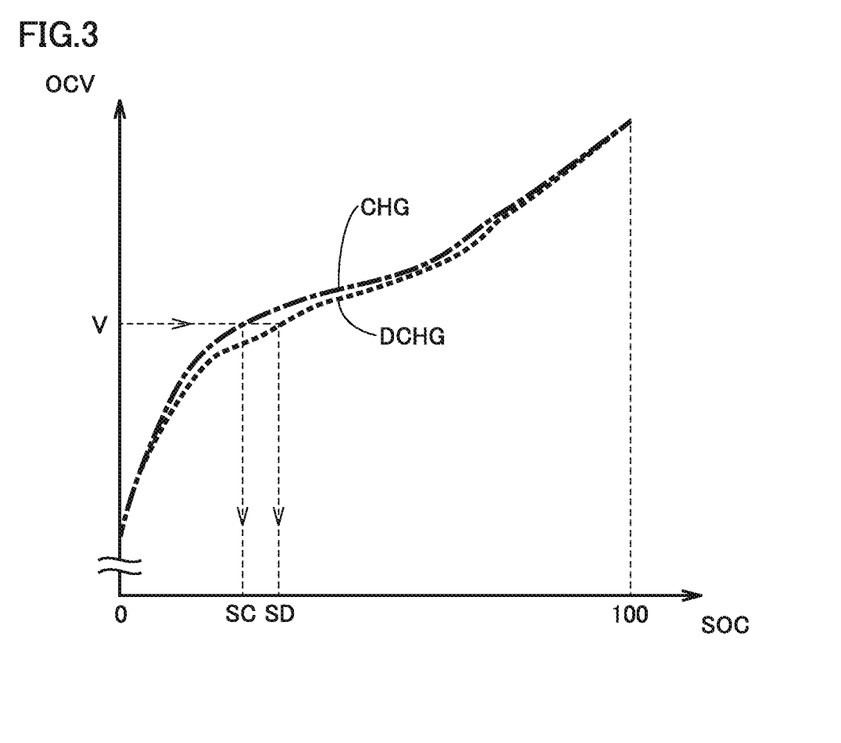
FIG. 3 shows one example of characteristic curves indicating a relation between an OCV and an SOC of a battery.
Figure 4:
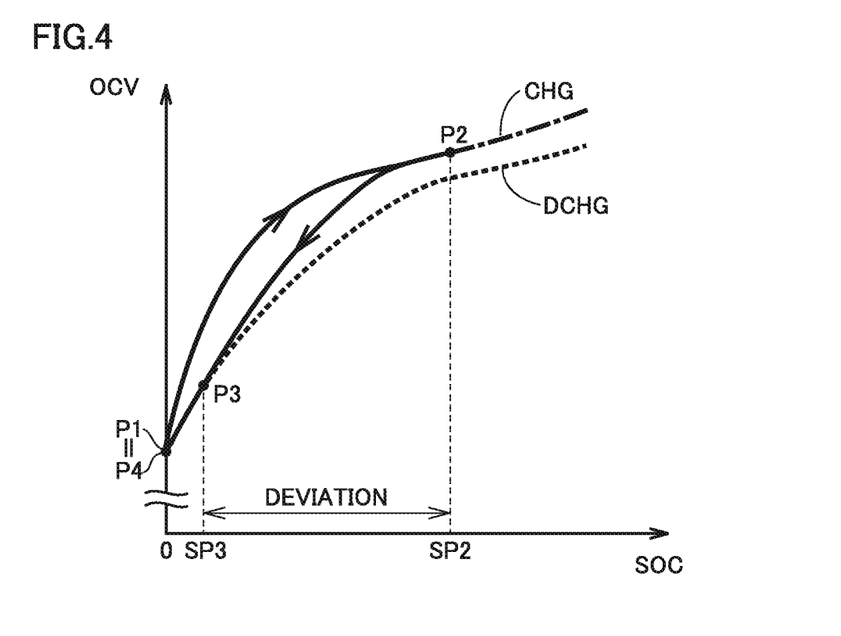
FIG. 4 is a diagram for illustrating a charging and discharging history of the battery.
Figure 5:
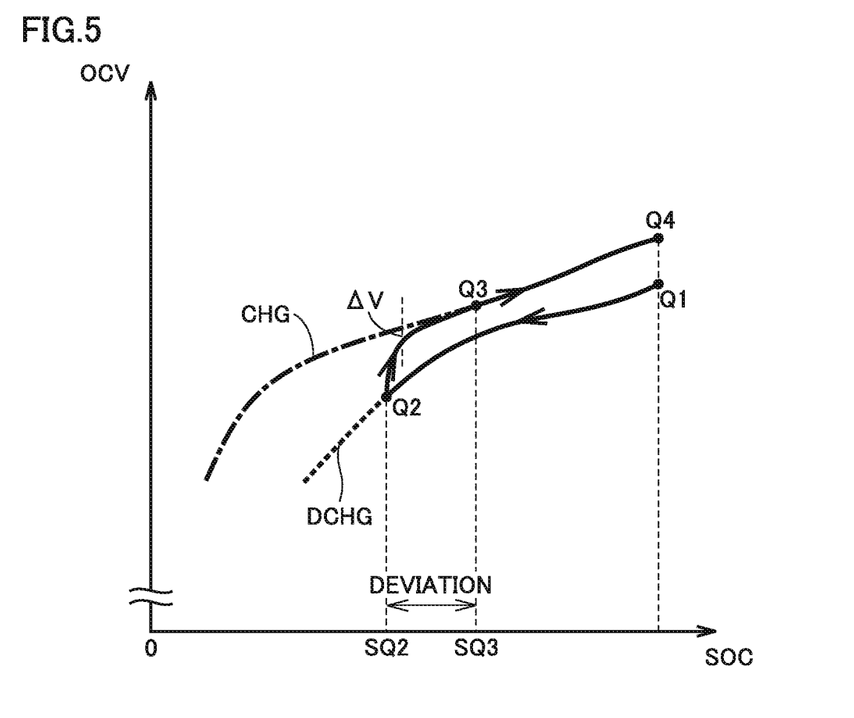
FIG. 5 is a diagram for illustrating one example of hysteresis elimination in the present embodiment.

FIG. 3 shows one example of the characteristic curves indicating the relation between the OCV and the SOC of battery 10. In FIG. 3 and FIGS. 4 and 5 below, the horizontal axis represents the SOC of battery 10, and the vertical axis represents the OCV of battery 10.

Referring to FIG. 3, the charging curve (also referred to as "charging OCV") denoted by the reference character "CHG" and indicated by an alternate long and short dash line indicates the relation between the OCV and the SOC when battery 10 is charged from SOC=0% (completely discharged state) to SOC=100% (fully charged state). On the other hand, the discharging curve (also referred to as "discharging OCV") denoted by the reference character "DCHG" and indicated by a broken line indicates the relation between the OCV and the SOC when battery 10 is discharged from SOC=100% to SOC=0%. Both of charging curve CHG and discharging curve DCHG of battery 10 are stored in memory 100B of ECU 100.

In the example shown in FIG. 3, when the OCV of battery 10 is V, for example, the SOC is estimated as SC by referring to charging curve CHG during charging of battery 10. On the other hand, during discharging of battery 10, the SOC is estimated as SD by referring to discharging curve DCHG. In this way, the two types of characteristic curves are prepared, and thus, the influence of the hysteresis can be reduced and the accuracy of estimation of the SOC can be enhanced.

However, as described below, an actual state (combination of the OCV and the SOC) of battery 10 may deviate from both of charging curve CHG and discharging curve DCHG, depending on a charging and discharging history of battery 10.

FIG. 4 is a diagram for illustrating one example of the charging and discharging history of battery 10. In FIG. 4, a change in the state of battery 10 in the order of P1-P2-P3-P4 is indicated by a solid line. More specifically, in this charging and discharging history, battery 10 is charged from SOC=0% (indicated by P1) to SOC=SP2 (e.g., SOC=20%) (indicated by P2), and then, battery 10 is discharged through SOC=SP3 (indicated by P3) to SOC=0% (indicated by P4).

In the example shown in FIG. 4, the actual state (see the solid line) of battery 10 is represented on charging curve CHG during charging from P1 to P2. On the other hand, in this example, the actual state of battery 10 may deviate from discharging curve DCHG during discharging from P2 to P3. In this case, it may be impossible to obtain the desired accuracy of estimation of the SOC, even by referring to discharging curve DCHG.

Under such circumstances, the present inventors have focused attention on the fact that, when battery 10 is charged with an amount of electric power equal to or larger than a prescribed amount after discharging of battery 10 (discharging may be stopped during discharging of battery 10), the influence of the hysteresis is eliminated and the state (combination of the OCV and the SOC) of battery 10 moves onto charging curve CHG quickly. Control for eliminating the influence of the hysteresis by charging battery 10 with the amount of electric power equal to or larger than the prescribed amount as described above will also be referred to as "hysteresis elimination control". In the present embodiment, an OCV is again obtained after the hysteresis elimination control is executed, and the SOC is estimated from the OCV.

Although "after discharging of battery 10" includes a state after battery 10 is continuously discharged, "after discharging of battery 10" is not limited thereto and may include a state after battery 10 is basically discharged although battery 10 is temporarily charged for a certain time period (a so-called excessively discharged state). In addition, "elimination" of the hysteresis may include "mitigation" meaning partial elimination of the hysteresis.

FIG. 5 is a diagram for illustrating one example of the hysteresis elimination control in the present embodiment. In FIG. 5, a change in the state of battery 10 in the order of Q1-Q2-Q3-Q4 is indicated by a solid line. More specifically, in this charging and discharging history, battery 10 is discharged from SOC=SQ1 (e.g., 30%) (indicated by Q1) to SOC=SQ2 (e.g., 14%) (indicated by Q2), and then, battery 10 is charged through Q3 to SOC=SQ1 (indicated by Q4).

When FIG. 4 and FIG. 5 are compared with each other, it can be seen that a region (region between SQ2 and SQ3 in FIG. 5) where a deviation occurs between the actual state and charging curve CHG during charging of battery 10 is narrower than an SOC region (region between SP3 and SP2 in FIG. 4) where a deviation occurs between the actual state and discharging curve DCHG during discharging of battery 10. This means that the hysteresis can be quickly eliminated by charging battery 10 with the amount of electric power equal to or larger than the prescribed amount after discharging of battery 10. In the state in which the hysteresis has been eliminated (SOC region greater than SQ3 in FIG. 5), the SOC can be estimated with a higher degree of accuracy using charging curve CHG, than in the state in which the hysteresis is not eliminated (SOC region between SQ2 and SQ3).

<Determination of Amount of Charging Electric Power>

There is a correlation between the amount of charging electric power for battery 10 for eliminating the hysteresis and the accuracy of estimation of the SOC. Therefore, the amount of charging electric power for battery 10 can be predetermined by preliminarily obtaining a relation between the amount of charging electric power and an SOC estimation error (or accuracy of estimation).

Figure 6:
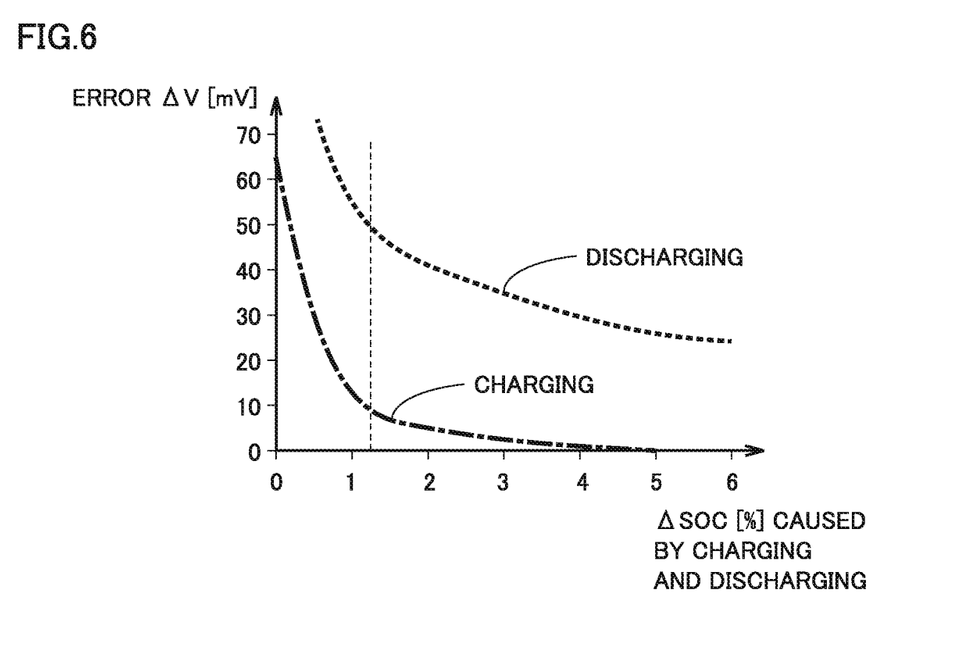
FIG. 6 shows one example of a measurement result for determining an amount of charging electric power for the battery.

FIG. 6 shows one example of a measurement result for determining the amount of charging electric power (corresponding to "prescribed amount" according to the present disclosure) for battery 10. In FIG. 6, the horizontal axis represents an amount of change in SOC caused by charging and discharging (an amount of increase in SOC caused by charging of discharged battery 10 or an amount of decrease in SOC caused by discharging of charged battery 10). Hereinafter, a magnitude (absolute value) of the amount of change in SOC will also be denoted as "ΔSOC". The vertical axis represents an error between an OCV on charging curve CHG and an actual OCV, or an error between an OCV on discharging curve DCHG and an actual OCV. Hereinafter, the error will also be denoted as "ΔV".

Referring to FIG. 6, when comparison is made under the condition of ΔSOC being equal, it can be seen that error ΔV is smaller in the case of charging discharged battery 10 (see an alternate long and short dash line) than in the case of discharging charged battery 10 (see a broken line). This supports the foregoing description when FIG. 4 and FIG. 5 are compared with each other.

In addition, in the example shown in FIG. 6, when the amount of charging electric power for battery 10 is small, error ΔV is large to some extent. For example, when ΔSOC is less than 1.2%, error ΔV is not less than 15 mV. This measurement result shows that the effect of hysteresis elimination is small when ΔSOC is less than 1.2%. On the other hand, when ΔSOC is not less than 1.2%, error ΔV has a very small value of less than 15 mV. Furthermore, when ΔSOC is 5%, error ΔV is almost zero. As described above, it can be seen that by making ΔSOC large to some extent, the effect of hysteresis elimination is increased, as compared with when ΔSOC is small.

The amount of charging electric power for battery 10 can be determined as appropriate, depending on the requested magnitude of error ΔV. For example, when it is requested to suppress error ΔV to approximately 15 mV, the amount of charging electric power for battery 10 can be set at an amount of electric power corresponding to or larger than ΔSOC=1.2%.

On the other hand, when the amount of charging electric power for battery 10 is set too large (i.e., when requested error ΔV is set too small and the excessive accuracy of estimation of the SOC is requested), an opportunity to allow such charging can be reduced. Specifically, it can take a long time to charge battery 10. When engine 530 is driven to charge battery 10 as described below, an amount of fuel consumption increases, and thus, it can become difficult to execute control for charging battery 10 at high frequency. Therefore, it is preferable to determine the amount of charging electric power for battery 10 in consideration of a balance between the magnitude of error ΔV (accuracy of estimation of the SOC) and the opportunity of charging (such as the charging time and the amount of fuel consumption).

The measurement result shown in FIG. 6 is merely one example of a measurement result in the configuration of battery 10 in the present embodiment. The measurement result shown in FIG. 6 can be determined experimentally (or by simulation), depending on the configuration of battery 10 (more specifically, the type of the alloy-based active material and the carbonic active material, a mixing ratio between the alloy-based active material and the carbonic active material, and the like). By doing so, the amount of charging electric power for battery 10 can be determined as appropriate, depending on the requested magnitude of error ΔV.

<Process Flow of SOC Estimation Control>

Finally, control for estimating the SOC of battery 10 (SOC estimation control) will be described. In the present embodiment, as described above, the hysteresis is eliminated as a result of charging of battery 10, and then, the SOC of battery 10 is estimated.

Figure 7:
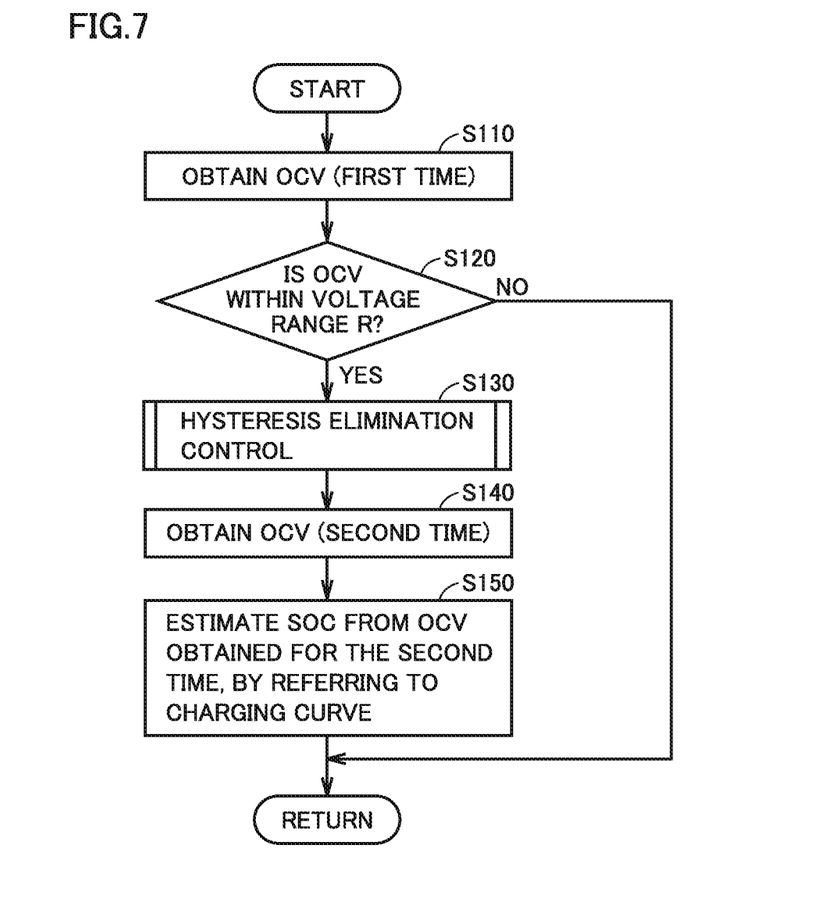
FIG. 7 is a flowchart for illustrating SOC estimation control in the present embodiment.

FIG. 7 is a flowchart for illustrating the SOC estimation control in the present embodiment. This flowchart is called from a main routine (not shown) and executed every time a prescribed condition is satisfied or a prescribed cycle elapses. Each step (hereinafter, abbreviated as "S") included in the flowchart shown in FIG. 7 and FIG. 8 below is basically implemented by software processing with ECU 100. However, each step may be implemented by hardware processing with an electronic circuit formed in ECU 100.

In S110, ECU 100 obtains an OCV ("first voltage" according to the present disclosure) of battery 10. The OCV of battery 10 can be obtained by measuring voltage VB of battery 10 in a no-load state with the voltage sensor as described above.

In S120, ECU 100 determines whether or not the OCV obtained in S110 is within a prescribed voltage range R. Voltage range R is a voltage range in which the SOC corresponding to the OCV during charging is different from that during discharging (hysteresis occurs) and the hysteresis can be eliminated by the hysteresis elimination control, and is predetermined by an experiment. When the OCV is outside voltage range R (NO in S120), ECU 100 skips S130 to S150 and returns the process to the main routine.

When the OCV obtained in S110 is within voltage range R (YES in S120), ECU 100 executes the hysteresis elimination control for eliminating the hysteresis in accordance with the charging and discharging history of battery 10 (S130).

Figure 8:
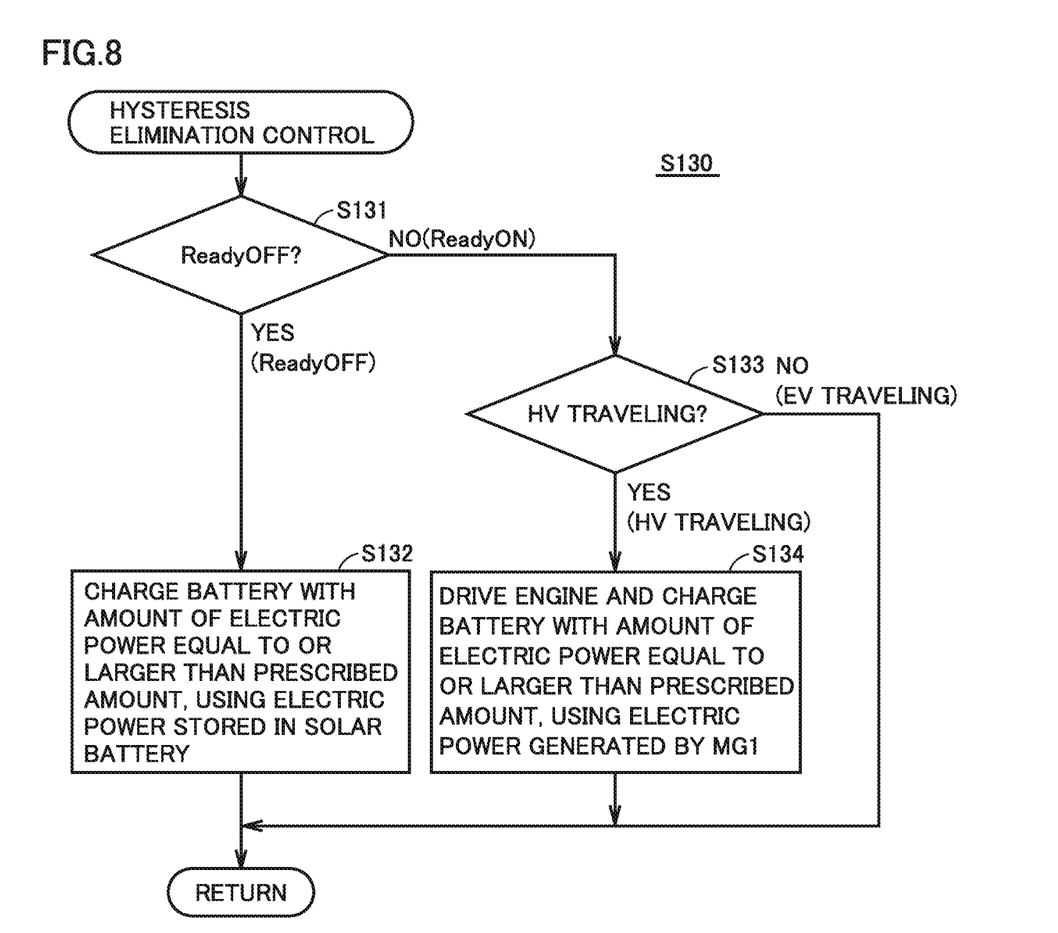
FIG. 8 is a flowchart for illustrating hysteresis elimination control shown in FIG. 7.

FIG. 8 is a flowchart for illustrating the hysteresis elimination control (processing in S130) shown in FIG. 7. Referring to FIG. 8, in S131, ECU 100 determines whether or not vehicle 1 is in a ReadyOFF state (state in which vehicle 1 is ignition-off and cannot travel).

When vehicle 1 is in the ReadyOFF state (YES in S131), engine 530 cannot be started, and PCU 40 cannot be driven, either, because SMR 20 is out of conduction. Therefore, ECU 100 closes charging relay 30. Furthermore, ECU 100 controls solar PCU 50 (more specifically, high-voltage DC/DC converter 52) such that battery 10 is charged with an amount of electric power equal to or larger than a prescribed amount, using electric power stored in solar battery 300 (S132). In addition to or instead of the above-described control, ECU 100 may control solar PCU 50 (more specifically, solar DC/DC converter 54) such that battery 10 is charged with electric power generated by solar panel 200. Since the method for determining the amount of charging electric power for battery 10 has been described with reference to FIG. 6, detailed description will not be repeated. Thereafter, the process is returned to the flowchart shown in FIG. 7.

On the other hand, when vehicle 1 is not in the ReadyOFF state, i.e., when vehicle 1 is in a ReadyON state (NO in S131), ECU 100 moves the process to S133 and determines whether or not vehicle 1 is in HV traveling. "HV traveling" is not limited to a state in which vehicle 1 is actually traveling, and may include a state in which vehicle 1 is in a (temporary) stop state in an HV mode.

When vehicle 1 is in HV traveling (YES in S133), ECU 100 controls PCU 40 and engine 530 such that battery 10 is charged with the amount of electric power equal to or larger than the prescribed amount (S134). More specifically, ECU 100 starts engine 530 (or maintains engine 530 in a driven state). Then, ECU 100 controls PCU 40 such that battery 10 is charged with electric power generated by motor generator 510 using motive power of engine 530 (i.e., such that the electric power greater than the motive power required for traveling of vehicle 1 is generated by motor generator 510). The method for determining the amount of charging electric power for battery 10 is equivalent to the method described with reference to FIG. 6. Thereafter, ECU 100 returns the process to the flowchart shown in FIG. 7.

When vehicle 1 is not in HV traveling, i.e., when vehicle 1 is in EV traveling (may include a state in which vehicle 1 is in a stop state in an EV mode), driving of engine 530 is prohibited. Therefore, ECU 100 skips S134 and returns the process to the flowchart shown in FIG. 7.

Although not shown, when vehicle 1 is in EV traveling, ECU 100 may move the process to charging of battery 10 with the electric power stored in solar battery 300 (S132). When vehicle 1 is traveling on a downward slope and it is expected that battery 10 can be charged with sufficient regenerative power (e.g., an amount of electric power corresponding to ΔSOC=1.2% or more), the hysteresis elimination control may be continued until battery 10 is charged with the amount of electric power.

Referring again to FIG. 7, in S140, ECU 100 again obtains an OCV ("second voltage" according to the present disclosure) of battery 10. This OCV can be obtained by a method similar to the method described in S110.

In S150, ECU 100 estimates the SOC from the OCV obtained in S140, by referring to charging curve CHG shown in FIGS. 3 to 5.

As described above, according to the present embodiment, when the OCV (first voltage) of battery 10 is included within voltage range R where the hysteresis in accordance with the charging and discharging history of battery 10 occurs, ECU 100 executes "hysteresis elimination control" for actively charging battery 10 with the amount of electric power equal to or larger than the prescribed amount. Thereafter, ECU 100 again obtains the OCV (second voltage) of battery 10, and estimates the SOC from this OCV. As a result of execution of the hysteresis elimination control, the influence of the hysteresis is temporarily eliminated (mitigated) and the state (combination of the OCV and the SOC) of battery 10 is represented on charging curve CHG. Therefore, the SOC corresponding to the OCV can be uniquely determined from the OCV obtained for the second time, by referring to charging curve CHG, and thus, the accuracy of estimation of the SOC can be enhanced.

The present embodiment has been described in connection with the example in which the negative electrode active material of the secondary battery includes at least one of silicon oxide (SiO), silicon (Si) and tin (Sn) as the alloy-based active material. However, the negative electrode active material may include only silicon, or may include only tin, or may include only silicon oxide, of these three types of materials. That is, the alloy-based active material may include at least one of silicon, tin and silicon oxide.

In addition, although the present embodiment has been described in connection with the example in which battery 10 is charged with the electric power generated by motor generator 510 using the motive power of engine 530, a method for charging battery 10 is not limited thereto. For example, when vehicle 1 is a fuel cell vehicle not having an engine mounted thereon, battery 10 can be charged with electric power generated by a fuel cell unit (not shown).

Furthermore, the foregoing embodiment has been described in connection with the example in which battery 10 is charged with the electric power from solar panel 200 or solar battery 300. However, another power storage device (not shown) such as a secondary battery other than battery 10 or a capacitor may be mounted on vehicle 1 and battery 10 may be charged with electric power stored in the power storage device. Alternatively, battery 10 may be charged with electric power from auxiliary battery 400.

While the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A secondary battery system comprising:
a secondary battery where hysteresis occurs, the hysteresis being a phenomenon in which a state of charge (SOC) corresponding to an open circuit voltage (OCV) during charging is different from that during discharging;
a charger configured to charge the secondary battery; and
a controller configured to control the charger and to estimate an SOC of the secondary battery,
the controller being configured to:
obtain a first voltage that is an OCV of the secondary battery;
in response to a determination that the first voltage is within a voltage range where the hysteresis occurs, perform a hysteresis control process that comprises:
determining a prescribed amount of electric power to apply to the secondary battery that suppresses an error voltage to a requested magnitude of the error voltage based on a predetermined relation between amounts of change in SOC and error voltage magnitudes, wherein the error voltage represents a difference between the first voltage and an OCV on a charging curve; and
controlling the charger such that the secondary battery is charged with an amount of electric power larger than the prescribed amount of electric power;
obtain a second voltage that is an OCV of the charged secondary battery; and
estimate the SOC of the secondary battery from the second voltage according to a relation between the SOC and the OCV of the secondary battery.

2. The secondary battery system according to claim 1, wherein
the controller includes a memory having the charging curve and a discharging curve stored therein, the charging curve indicating a first relation between the OCV and the SOC of the secondary battery when the secondary battery is charged from a completely discharged state to a fully charged state, the discharging curve indicating a second relation between the OCV and the SOC of the secondary battery when the secondary battery is discharged from the fully charged state to the completely discharged state, and
the controller is further configured to estimate the SOC of the secondary battery using the obtained second voltage by identifying an SOC value of the charging curve that corresponds to the obtained second voltage.

3. The secondary battery system according to claim 2, wherein
the prescribed amount is determined such that an error between the OCV of the secondary battery charged with the amount of electric power larger than the prescribed amount and the OCV on the charging curve is smaller than a reference value.

4. The secondary battery system according to claim 1, wherein
the secondary battery is a lithium ion secondary battery having a negative electrode including an alloy-based active material, and
the alloy-based active material includes at least one of silicon, tin and silicon oxide.

5. A state of charge (SOC) estimation method for a secondary battery, for estimating an SOC of the secondary battery where hysteresis occurs, the hysteresis being a phenomenon in which an SOC corresponding to an open circuit voltage (OCV) during charging is different from that during discharging, the SOC estimation method for the secondary battery comprising:
obtaining a first voltage that is an OCV of the secondary battery;
in response to a determination that the first voltage is within a voltage range where the hysteresis occurs, perform a hysteresis control process that comprises:
determining a prescribed amount of electric power to apply to the secondary battery that suppresses an error voltage to a requested magnitude of the error voltage based on a predetermined relation between amounts of change in SOC and error voltage magnitudes, wherein the error voltage represents a difference between the first voltage and an OCV on a charging curve; and charging the secondary battery with an amount of electric power equal to or larger than the prescribed amount of electric power;

obtaining a second voltage that is an OCV of the secondary battery after performing the charging; and estimating the SOC of the secondary battery from the second voltage according to a relation between the SOC and the OCV of the secondary battery.

6. The SOC estimation method for the secondary battery according to claim 5, wherein the estimating the SOC of the secondary battery comprises:

identifying an SOC value of the charging curve that corresponds to the obtained second voltage, the charging curve indicating a relation between the OCV and the SOC of the secondary battery when the secondary battery is charged from a completely discharged state to a fully charged state.

7. The secondary battery system according to claim 1, further comprising:

a voltage sensor configured to detect a voltage of the secondary battery;

a current sensor configured to detect a current input and output to and from the secondary battery, wherein the controller is further configured to obtain the first voltage that is the OCV of the secondary battery from the voltage sensor when the current sensor detects that a no-load state continues for a predetermined time period.

8. The SOC estimation method for the secondary battery according to claim 5, wherein the obtaining the first voltage that is the OCV of the secondary battery comprises:

obtaining the first voltage that is the OCV of the secondary battery from a voltage sensor when a current sensor detects that a no-load state continues for a predetermined time period.

9. The secondary battery system according to claim 1, wherein the determining of the prescribed amount of electric power comprises:

determining the prescribed amount of electric power based on a balance between the requested magnitude of the error voltage and a charging opportunity having a charging time and a fuel consumption.

10. The SOC estimation method for the secondary battery according to claim 5, wherein the determining of the prescribed amount of electric power comprises:

determining the prescribed amount of electric power based on a balance between the requested magnitude of the error voltage and a charging opportunity having a charging time and a fuel consumption.

* * * * *